(12) United States Patent
Okuma

(10) Patent No.: US 11,810,634 B2
(45) Date of Patent: Nov. 7, 2023

(54) COMPUTER SYSTEM WITH REDUNDANCY HAVING FAIL TEST MODE

(71) Applicant: MICRON TECHNOLOGY, INC., Boise, ID (US)

(72) Inventor: Sadayuki Okuma, Tama (JP)

(73) Assignee: Micron Technology, Inc., Boise, ID (US)

( * ) Notice: Subject to any disclaimer, the term of this patent is extended or adjusted under 35 U.S.C. 154(b) by 388 days.

(21) Appl. No.: 17/243,086

(22) Filed: Apr. 28, 2021

(65) Prior Publication Data

US 2022/0351797 A1 Nov. 3, 2022

(51) Int. Cl.

| G11C 29/00 | (2006.01) |
|---|---|
| G11C 29/38 | (2006.01) |
| G11C 17/16 | (2006.01) |
| G11C 29/14 | (2006.01) |
| G11C 11/4096 | (2006.01) |
| G11C 11/4093 | (2006.01) |
| G11C 17/18 | (2006.01) |

(52) U.S. Cl.
CPC .......... *G11C 29/38* (2013.01); *G11C 11/4093* (2013.01); *G11C 11/4096* (2013.01); *G11C 17/16* (2013.01); *G11C 17/18* (2013.01); *G11C 29/14* (2013.01)

(58) Field of Classification Search
CPC ..... G11C 29/38; G11C 29/14; G11C 11/4093; G11C 11/4096; G11C 17/16; G11C 17/18
See application file for complete search history.

(56) References Cited

U.S. PATENT DOCUMENTS

| 8,001,434 B1* | 8/2011 | Lee | G11C 29/12 |
| | | | 714/719 |
| 2005/0102595 A1* | 5/2005 | Seo | G11C 29/12 |
| | | | 714/736 |
| 2022/0093194 A1* | 3/2022 | Lee | G11C 16/3459 |

* cited by examiner

*Primary Examiner* — Christine T. Tu
(74) *Attorney, Agent, or Firm* — Dorsey & Whitney LLP

(57) ABSTRACT

Disclosed herein is an apparatus that includes a data terminal, a memory cell array, a mode register storing a plurality of operation parameters, and an output circuit configured to output, in response to a read command, an incorrect data to the data terminal instead of a correct data read from the memory cell array when a predetermined one of the operation parameters indicates a test mode.

20 Claims, 7 Drawing Sheets

| MRW_xxx | Description |
|---|---|
| op0 | Normal operation |
| op1 | Sometimes, output all L in READ command |
| op2 | Often, output all L in READ command |
| op3 | READ command doesn't work, output Hi-Z always after 10sec later than MRW set |

COMPUTER SYSTEM WITH REDUNDANCY HAVING FAIL TEST MODE

BACKGROUND

A computer system sometimes has redundancy so as to enable a normal operation to be continued even if a failure occurs in some devices. However, it is not easy to practically verify whether a failover is correctly performed when a failure occurs in a semiconductor device such as a DRAM (Dynamic Random Access Memory).

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
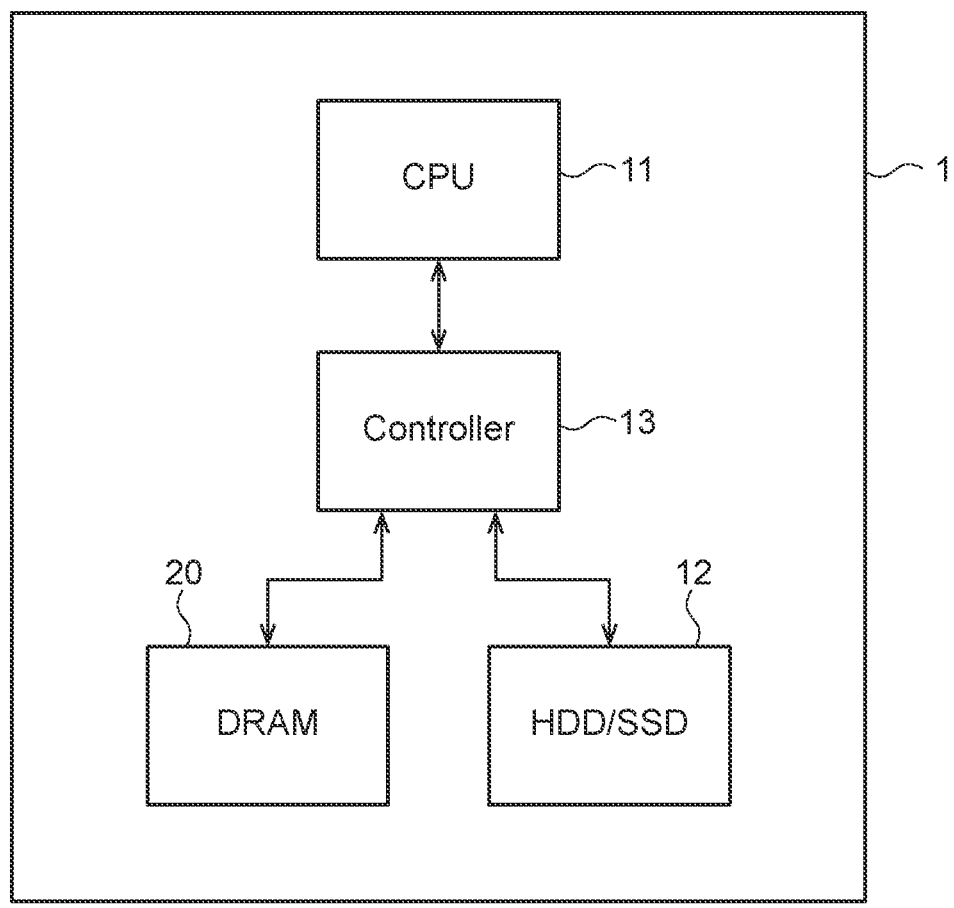
FIG. 1 is a block diagram showing an example of a computer system.
Figure 2A:
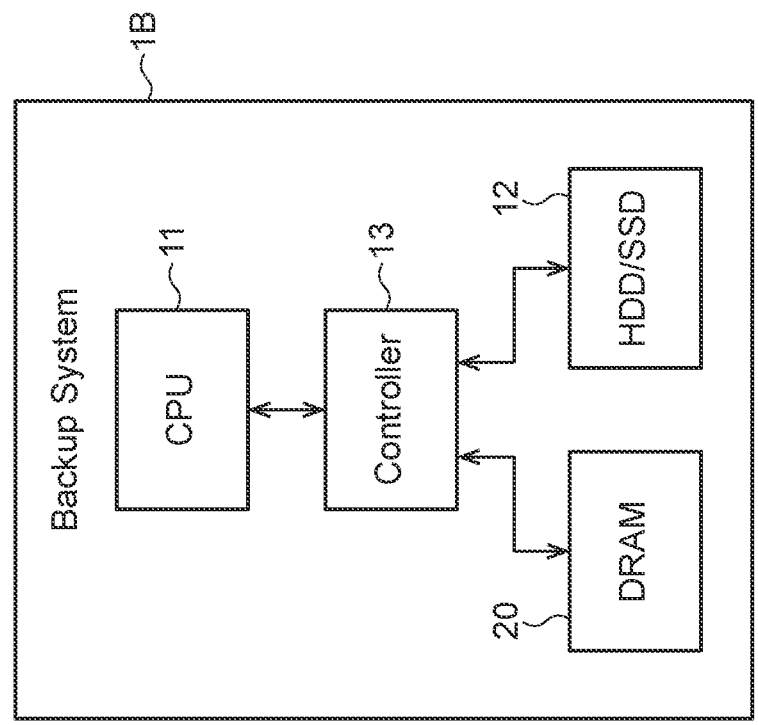
FIGS. 2A to 2C are block diagrams for explaining some failover methods.
Figure 2A:
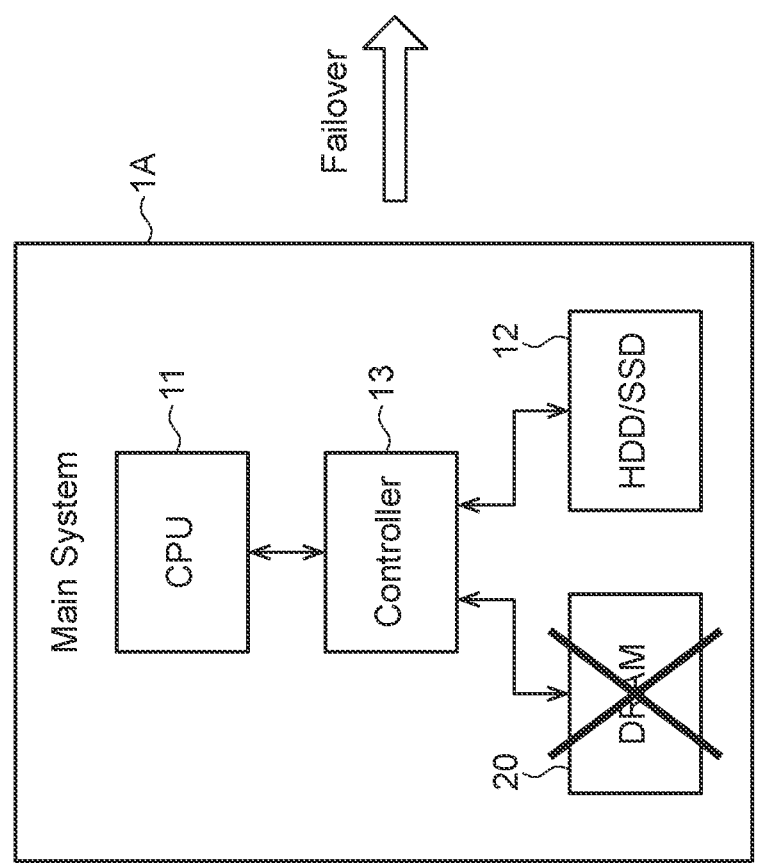
Figure 2B:
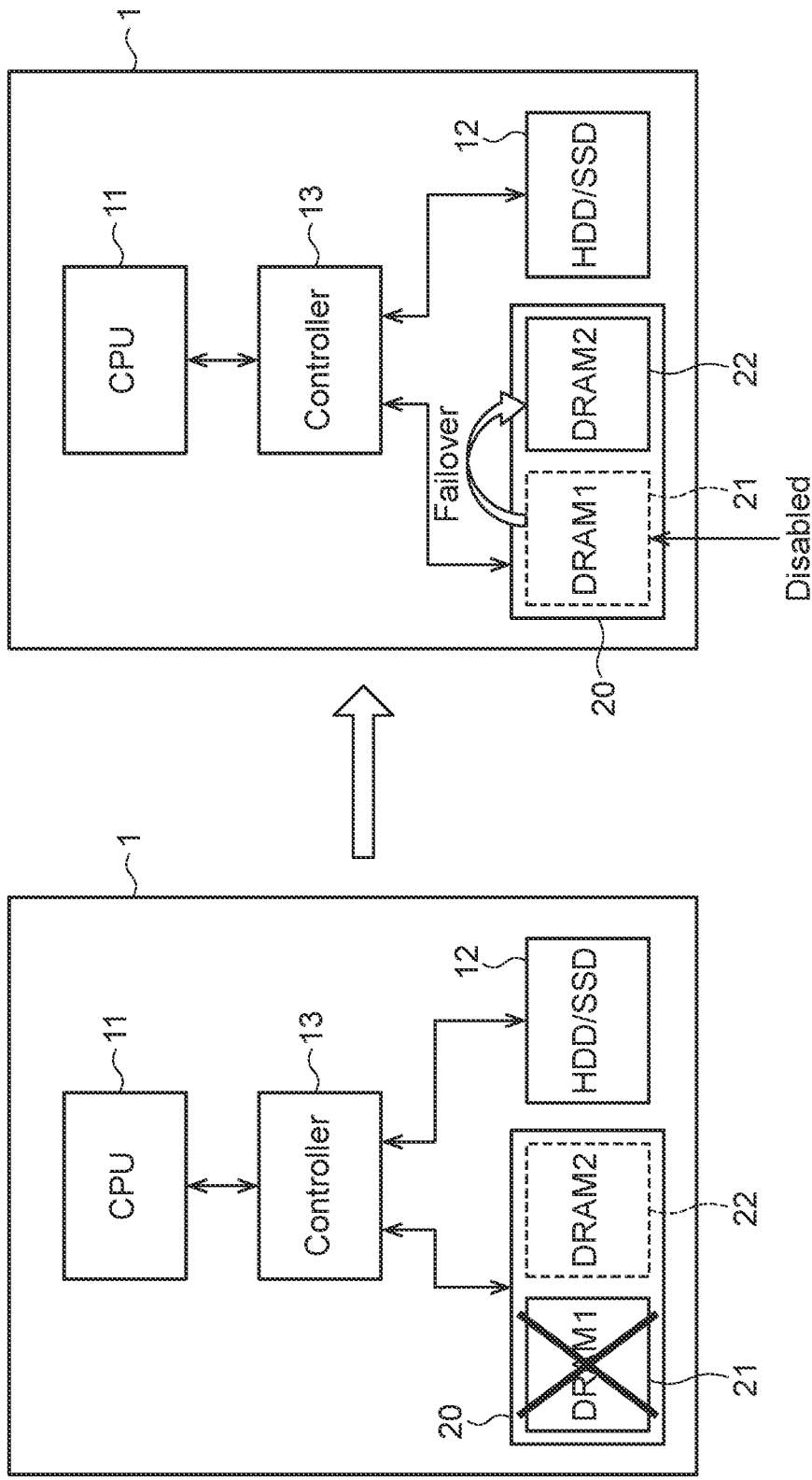
Figure 2C:
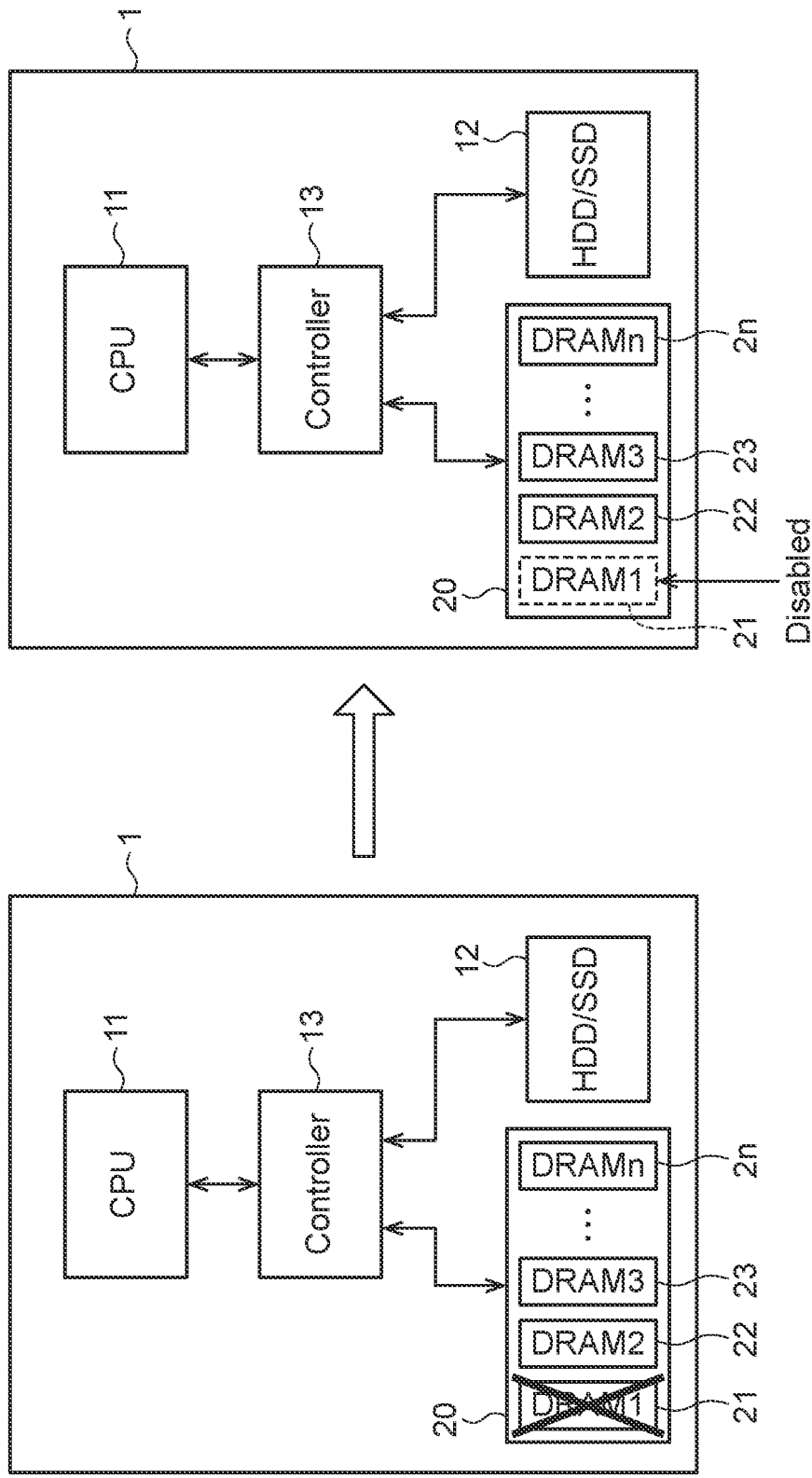

A computer system 1 shown in FIG. 1 includes a CPU 11, an HDD/SSD 12, a controller 13, and a DRAM 20. The CPU 11 is connected to the HDD/SSD 12 and the DRAM 20 via the controller 13. If a failure occurs in some device in the computer system 1, the entire system stops. To prevent this problem, many systems have a failover function. In an example shown in FIG. 2A, a main system 1A and a backup system 1B are prepared and the main system 1A is operated in normal times. When a failure occurs in a device, for example, the DRAM 20 included in the main system 1A, the main system 1A is stopped and the backup system 1B is operated instead. In an example shown in FIG. 2B, a main DRAM 21 and an auxiliary DRAM 22 are prepared in the computer system 1, and the main DRAM 21 is used in normal times while the auxiliary DRAM 22 is disabled. When a failure occurs in the main DRAM 21, failover to the auxiliary DRAM 22 is performed and the main DRAM 21 is disabled. In an example shown in FIG. 2C, a plurality of DRAMs 21 to 2n are prepared in the computer system 1 and the DRAM 21 is disabled to realize fallback, for example, when a failure occurs in the DRAM 21. Such a failover or fallback prevents the entire system from being immediately stopped even if a failure occurs in some device.

However, it is not easy to test whether a failover correctly functions in practice. For example, when a failure in an external storage device such as the HDD/SSD 12 is to be simulated, a test can be performed by a method of powering off the HDD/SSD 12 or detaching a cable therefrom. However, since semiconductor devices such as the DRAM 20 are mounted on a motherboard directly or in a modularized manner, a state in which a failure occurs therein generally cannot be simulated. The present disclosure relates to a DRAM where a state in which a failure occurs can be simulated.

Figure 3:
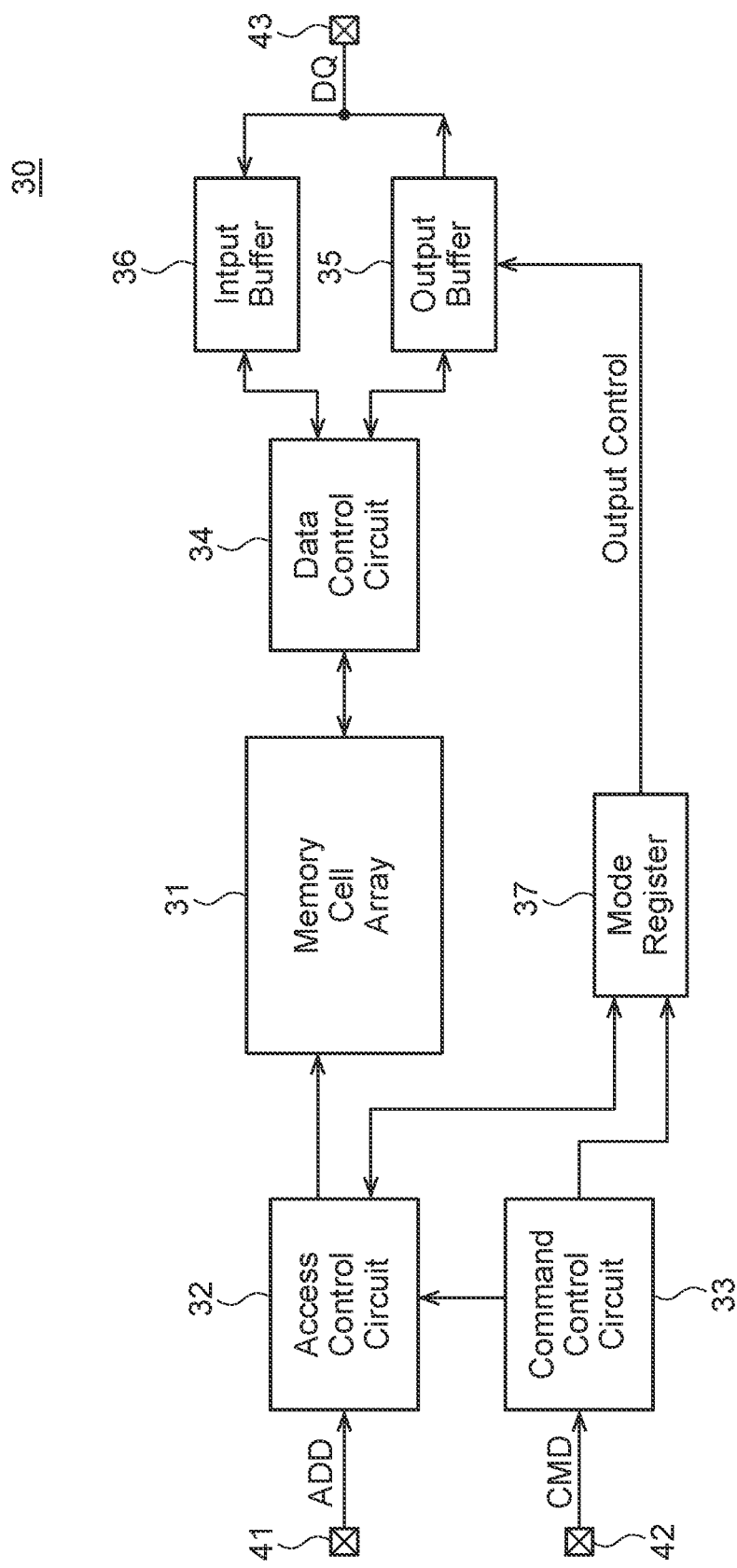
FIG. 3 is a block diagram showing a configuration of a DRAM according to an embodiment of the disclosure.

FIG. 3 is a block diagram showing a configuration of a DRAM according to an embodiment of the disclosure. A DRAM 30 shown in FIG. 3 includes a memory cell array 31, an access control circuit 32, a command control circuit 33, and external terminals 41 to 43. The external terminal 41 is an address terminal supplied with an address signal ADD from outside. The address signal ADD is supplied to the access control circuit 32. The external terminal 42 is a command terminal supplied with a command signal CMD from outside. The command signal CMD is supplied to the command control circuit 33. The command signal CMD includes a read command issued at the time of a read operation, a write command issued at the time of a write operation, a mode-register set command issued at the time of mode register setting, and the like. When the command signal CMD indicates a read command, the access control circuit 32 accesses the memory cell array 31 according to the address signal ADD and reads a data retained in a memory cell designated by the address signal ADD. The read data having been read from the memory cell array 31 is transferred to an output buffer 35 via a data control circuit 34. The output buffer 35 outputs the read data DQ to outside from the external terminal 43. When the command signal CMD indicates a write command, the access control circuit 32 accesses the memory cell array 31 according to the address signal ADD and overwrites a write data DQ to a memory cell designated by the address signal ADD. The write data DQ is supplied to the external terminal 43 and is supplied to the memory cell array 31 via an input buffer 36 and the data control circuit 34. As described above, the external terminal 43 is a data terminal for inputting and outputting a data DQ.

Further, when the command signal CMD indicates a mode-register set command, the access control circuit 32 transfers the address signal ADD to a mode register 37. Accordingly, a setting value in the mode register 37 is overwritten. A plurality of parameters such as a latency, a driver strength, and a slew rate are written to the mode register 37. In the DRAM 30 according to the present disclosure, a parameter related to a test mode for simulating a state in which a failure occurs is included in the mode register 37.

Figures 4, 5:
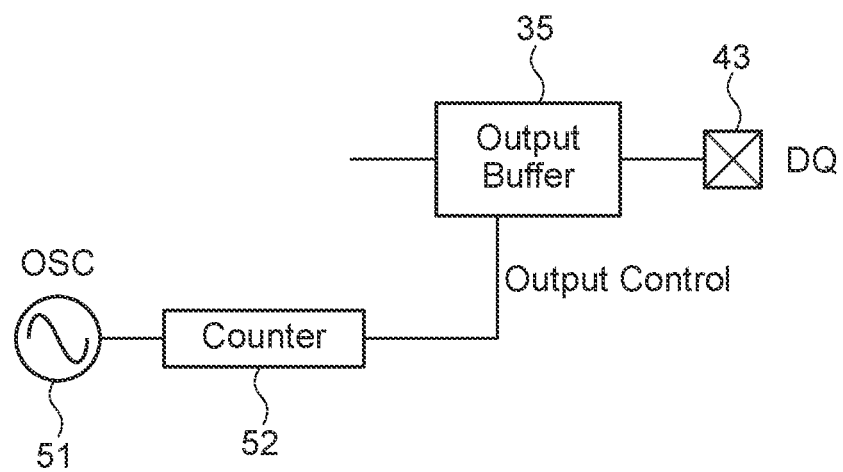
FIG. 4 is a table for explaining predetermined parameters set in a mode register according to an embodiment of the disclosure.
FIG. 5 is a circuit diagram showing a circuit that outputs an incorrect read data DQ at each certain time period according to an embodiment of the disclosure.

FIG. 4 is a table for explaining predetermined parameters set in a mode register according to an embodiment of the disclosure. In an example shown in FIG. 4, a setting value MRW_xxx in the mode register 37 is a parameter related to the test mode described above. When the setting value MRW_xxx indicates option 0, the DRAM 30 operates on a normal operation mode. In the normal operation mode, the read data DQ having been read from the memory cell array 31 is output from the external terminal 43 when a read command is issued from outside (e.g., data having the expected value is output). The initial value of the setting value MRW_xxx is option 0 and the value of the setting value MRW_xxx is always set to option 0 upon power-on.

In contrast, when the setting value MRW_xxx indicates any of option 1 to option 3, the DRAM 30 operates on a test mode for simulating a state in which a failure occurs. When the DRAM 30 enters the test mode, the operation of the output buffer 35 changes. The operations of other circuits such as the access control circuit 32 and the command control circuit 33 do not change. Therefore, a read command mode-register set command can be input also after entry into the test mode and the internal circuits of the DRAM 30 other than the output buffer 35 perform the same operations as those in a case where the DRAM 30 is on the normal operation mode according to the input command. However, the operations of the internal circuits of the DRAM 30 other than the output buffer 35 may be partially stopped after entry into the test mode.

When the setting value MRW_xxx in the mode register 37 indicates option 1, an incorrect read data DQ (e.g., data having an unexpected value different from the expected value) is sometimes output in response to a read command, and correct read data DQ (e.g., data having an expected value) is otherwise output in response to the read command. When the setting value MRW_xxx in the mode register 37 indicates option 2, an incorrect read data DQ is often output in response to a read command, and correct read data DQ is otherwise output in response to the read command. That is, the frequency of outputting of an incorrect read data DQ is higher in the case in which the setting value MRW_xxx in the mode register 37 is op2 than in the case in which the setting value MRW_xxx is op1. An incorrect read data DQ has any value and may be fixed to a predetermined value, for example, all bits may be 0, that is, a low level (or some embodiments of the disclosure, all bits may be a 1, that is, a high level). An incorrect read data DQ may be output at any timing. For example, an incorrect read data DQ may be output each time a read command has been issued a predetermined number of times. Alternatively, in some embodiments of the disclosure, an oscillator circuit 51 and a counter 52 as shown in FIG. 5 may be used to output correct read data DQ at a certain time period. An alternative process may be adopted in which an incorrect read data DQ is not output immediately after the setting value MRW_xxx in the mode register 37 is set to option 1 or option 2 but output of an incorrect read data DQ is allowed after a predetermined time is elapsed, for example, 10 seconds after the setting value MRW_xxx is set to option 1 or option 2. When the setting value MRW_xxx in the mode register 37 is set to option 3, the data terminal 43 is brought into a high-impedance state 10 seconds after the setting, regardless of a read command. In this way, an output circuit outputs in response to a read command an incorrect data to the data terminal 43 instead of a correct data read from the memory cell array when a predetermined one of the operation parameters indicates a test mode. For example, when the setting value MRW_xxx in the mode register 37 is set to any of option 1 to option 3, a read data DQ having a correct value is not output and instead a read data DQ having an incorrect value is sporadically output or the data terminal 43 is brought into a high-impedance state even when a read command is input from outside. However, a read operation is correctly performed in the DRAM 30.

As described above, the DRAM 30 can simulate a state in which a failure occurs, by setting the setting value MRW_xxx in the mode register 37 to any of option 1 to option 3. This enables to verify whether a failover operation is correctly performed when a failure occurs in the DRAM 30. Since the test mode described above only restricts the operation of the output buffer 35 and the internal circuits other than the output buffer 35 continue to operate, the DRAM 30 can return to the normal operation mode by issuing a mode-register set command again and returning the setting value MRW_xxx in the mode register 37 to option 0 unlike in a case in which a failure actually occurs. For example, a failure in the main DRAM 21 shown in FIG. 2B can be simulated. The computer system 1 shown in FIG. 2B ordinarily operates on the first operation mode. In the first operation mode, the main DRAM 21 operates on a normal operation mode and the auxiliary DRAM 22 is disabled. In the normal operation mode, the main DRAM 21 outputs a read data to the controller 13 response to a read command issued from the controller 13. When the controller 13 issues a test command to the main DRAM 21, the main DRAM 21 is brought into a test mode. In the test mode, the main DRAM 21 outputs an incorrect read data having an unexpected value different from the expected value to the controller 13 in response to the read command. When the controller 13 receives an incorrect read data having an unexpected value from the main DRAM 21, the controller 13 is brought into the second operation mode from the first operation mode to enable the auxiliary DRAM 22. In the second operation mode, the main DRAM 21 is disabled. In this way, a failover to the auxiliary DRAM 22 can be simulated. After performing the simulation, the controller 13 returns back to the first operation mode and cancels the test command to bring the main DRAM 21 into the normal operation mode.

Figure 6A:
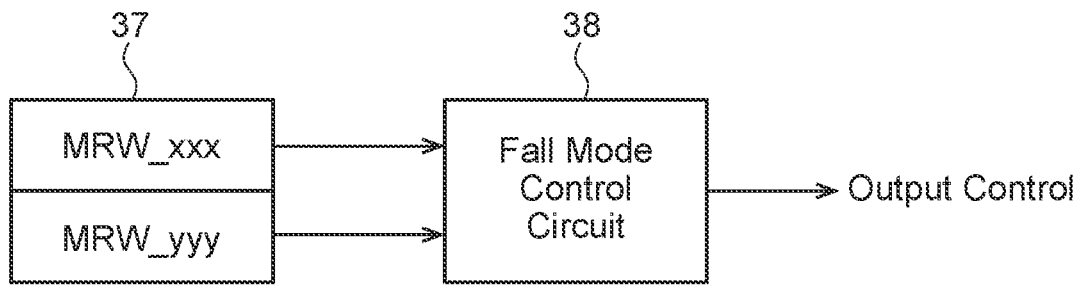
FIGS. 6A and 6B are circuit diagram showing a circuit that prevents incorrect entry into a test mode according to an embodiment of the disclosure.
Figure 6B:
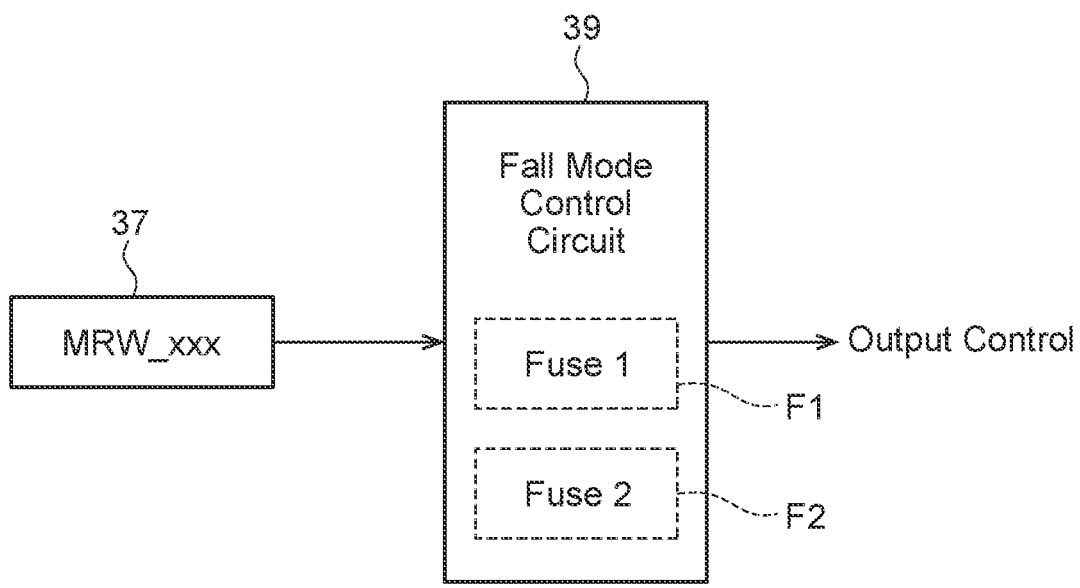

FIGS. 6A and 6B are circuit diagram showing a circuit that prevents incorrect entry into a test mode according to an embodiment of the disclosure. To prevent the setting value MRW_xxx in the mode register 37 from being unintentionally set to option 1 to option 3 in practical uses, a plurality of registers in the mode register 37 may be used as shown in FIG. 6A to monitor setting values of these registers using a fall mode control circuit 38. For example, a process in which the DRAM 30 enters the test mode under a condition that the test mode is set in both the setting value MRW_xxx and a setting value MRW_yyy may be adopted. When a process in which the DRAM 30 enters the test mode under a condition that the test mode is set in the setting value MRW_yyy after the test mode is set in the setting value MRW_xxx is applied, the possibility of incorrect entry into the test mode is greatly reduced. Alternatively, a process in which fuse elements F1 and F2 are provided in a fall mode control circuit 39 that monitors the setting value MRW_xxx in the mode register 37 and the DRAM 30 enters the test mode under a condition that the fuse element F1 is in a written state as shown in FIG. 6B may be adopted. According to this process, when a state in which a failure occurs is to be simulated, the setting value MRW_xxx in the mode register 37 needs to be rewritten after a write operation to the fuse element F1 is performed, and accordingly the possibility of incorrect entry into the test mode is almost eliminated. When a write operation to the fuse element F2 is performed after the simulation is completed, the entry into the test mode is invalidated. With use of electrically writable anti-fuse elements as the fuse elements F1 and F2, the simulation can be performed at any timing in practical uses. When write to the fuse element F2 is performed at a manufacturing step, entry of the DRAM 30 into the test mode in practical uses becomes impossible and the possibility of incorrect entry into the test mode is eliminated.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a data terminal;
   a memory cell array;
   a mode register storing a plurality of operation parameters; and
   an output circuit configured to output, in response to a read command, an incorrect data to the data terminal instead of a correct data read from the memory cell array when a predetermined one of the operation parameters indicates a test mode.

2. The apparatus of claim 1, wherein the output circuit is configured to output the incorrect data to the data terminal when a predetermined period is elapsed after the predetermined one of the operation parameters is set to the mode register.

3. The apparatus of claim 2, wherein the output circuit is configured to output the correct data to the data terminal until the predetermined period is elapsed after the predetermined one of the operation parameters is set to the mode register.

4. The apparatus of claim 1, wherein the incorrect data is fixed to a predetermined value.

5. The apparatus of claim 1, wherein the output circuit is configured to sometimes output the incorrect data to the data terminal in response to the read command when the predetermined one of the operation parameters indicates the test mode.

6. The apparatus of claim 1, wherein the output circuit is configured to bring the data terminal into high-impedance state when the predetermined one of the operation parameters indicates the test mode.

7. The apparatus of claim 1, wherein the output circuit is configured to output the incorrect data under a condition that at least two of the operation parameters indicate the test mode.

8. The apparatus of claim 1, further comprising a fuse circuit including a first fuse element,
   wherein the output circuit is configured to output the incorrect data under a condition that the first fuse element is in a written state.

9. The apparatus of claim 8,
   wherein the fuse circuit further includes a second fuse element, and
   wherein the output circuit is configured to output the correct data read from the memory cell array in response to a read command when the second fuse element is in a written state even if the first fuse element is in a written state.

10. The apparatus of claim 1, further comprising a fuse element,
   wherein the predetermined one of the operation parameters is disabled when the fuse element is in a written state.

11. An apparatus comprising:
   a plurality of external terminals including first and second terminals; and
   an internal circuit configured to output a data to outside from the first terminal in response to an input signal supplied from outside to the second terminal,
   wherein the internal circuit is configured to output the data having an expected value in response to the input signal in a normal operation mode, and
   wherein the internal circuit is configured to output the data having an unexpected value different from the expected value in response to the input signal in a test mode.

12. The apparatus of claim 11, wherein an operation mode of the internal circuit is changed from the normal operation mode to the test mode by inputting the input signal having a first value to the second terminal.

13. The apparatus of claim 12, wherein an operation mode of the internal circuit is changed from the test mode to the normal operation mode by inputting the input signal having a second value to the second terminal.

14. The apparatus of claim 13, wherein the internal circuit is configured to output the data having an unexpected value in response to the input signal when a predetermined period is elapsed after the operation mode of the internal circuit is changed from the normal operation mode to the test mode.

15. The apparatus of claim 14, wherein the internal circuit is configured to output the data having an expected value in response to the input signal until the predetermined period is elapsed after the operation mode of the internal circuit is changed from the normal operation mode to the test mode.

16. The apparatus of claim 11,
   wherein the internal circuit includes a memory cell array configured to store a plurality of data having an expected value,
   wherein the second terminal includes an address terminal supplied with an address signal and a command terminal supplied with a command signal, and
   wherein the internal circuit is configured to output the data read from the memory cell array according to the address signal and the command signal in the normal operation mode.

17. The apparatus of claim 16, wherein the internal circuit is configured to output the data having a fixed value instead of the data read from the memory cell array according to the address signal and the command signal in the test mode.

18. An apparatus comprising:
   first and second memory devices; and
   a controller configured to control the first and second memory devices,
   wherein the second memory device is disabled when the controller operates on a first operation mode,
   wherein the first memory device is disabled when the controller operates on a second operation mode,
   wherein the first memory device is configured to output a first data to the controller response to a read command issued from the controller during the first operation mode when the first memory device operates on a normal operation mode,
   wherein the controller is configured to issue a test command to the first memory device to bring the first memory device into a test mode during the first operation mode, wherein the first memory device is configured to output a second data having an unexpected value to the controller in response to the read command issued from the controller during the first operation mode when the first memory device operates on the test mode, and wherein the controller is configured to be brought into the second operation mode from the first operation mode to enable the second memory device when the second data has an unexpected value.

19. The apparatus of claim 18, wherein the controller is configured to cancel the test command to bring the first memory device into the normal operation mode after the controller is brought into the first operation mode from the second operation mode.

20. The apparatus of claim 18, wherein the first data is read from a memory cell array included in the first memory device, and wherein the second data is fix to a predetermined value.

* * * * *